United States Patent [19]

Josefowicz et al.

[11] Patent Number: 5,272,133
[45] Date of Patent: Dec. 21, 1993

[54] PASSIVATION OF THIN FILM OXIDE SUPERCONDUCTORS

[75] Inventors: Jack Y. Josefowicz, Westlake Village; David B. Rensch, Thousand Oaks; Kai-Wei Nieh, Monrovia, all of Calif.

[73] Assignee: Hughes Aircraft Company, Los Angeles, Calif.

[21] Appl. No.: 843,475

[22] Filed: Feb. 27, 1992

Related U.S. Application Data

[62] Division of Ser. No. 608,120, Nov. 1, 1990, Pat. No. 5,114,910.

[51] Int. Cl.$^5$ ............................ B05D 5/12; B32B 9/00
[52] U.S. Cl. .................................. 505/1; 505/701; 427/62; 427/126.3; 427/407.1; 204/192.22
[58] Field of Search ............................ 505/1, 701, 708; 427/62, 63, 407.1, 126.3; 428/930, 76, 473.5, 702; 204/298.02, 192.22

[56] References Cited

U.S. PATENT DOCUMENTS

| | | | |
|---|---|---|---|
| 4,341,924 | 7/1982 | Gleim | 427/62 |
| 4,470,190 | 9/1984 | Fulton et al. | 505/922 |
| 4,916,116 | 4/1990 | Yamazaki | 505/1 |
| 4,942,142 | 7/1990 | Itozaki et al. | 505/1 |

FOREIGN PATENT DOCUMENTS

0298866A2  1/1989  European Pat. Off. .
63-318015  12/1988  Japan .

OTHER PUBLICATIONS

"Reactivity and passivation for Bi adatoms on YBa$_2$Cu$_3$O$_{6.9}$ and Bi$_2$Ca$_{1+x}$Sr$_{2-x}$Cu$_2$O$_8$-x" H. M. Meyer, et al., Appl. Phys. Lett. 53(11), Sep. 12, 1988, pp. 1004-1006.
"Reactivity and passivation for Bi adatoms on YBa$_2$Cu$_3$O$_{6.9}$ and Bi$_2$Ca$_{1+x}$Sr$_{2-x}$Cu$_2$O$_8$" H. M. Meyer, et al., Appl. Phys. Lett. 53(11), Sep. 12, 1988, pp. 1004-1006.
"SiO$_2$ and Si$_3$N$_4$ passivation layers on Y-Ba-Cu-O thin films", Q. X.Jian, et al., J. Appl. Phys. 66(1), Jul. 1, 1989, pp. 452-454.
"Surface and Interface Properties of High-Temperature Superconductors", H. Meyer, III, et al., Chemistry of High-Temperature Superconductors, (Jul. 1988) pp. 280-290.
"Stability limits of the perovskite structure in the Y-Ba-Cu-O system", R. bormann et al., Appl. Phys. Letter 54(21) May 22, 1989, vol. 54, pp. 2148-2150.
J. Appl. Phys. 66(1), Jul. 1, 1989, pp. 452-454.
"Surface and Interface Properties of High-Temperature Superconductors", H. Meyer, III, et al., Chemistry of High-Temperature Superconductors, (Jul. 1988) pp. 280-290.
"Stability limits of the perovskite structure in the Y-Ba-Cu-O system", R. Bormann et al., Appl. Phys. Letter 54(21) May 22, 1989, vol. 54, pp. 2148-2150.
"Oxygen ordering and the orthorhombic-to-tetragonal phase transition in YBa$_2$Cu$_3$O$_{7-x}$", J. D. Jorgensen et al., Physical Review B, vol. 36, No. 7, Sep. 1987 pp. 3608-3616.

(List continued on next page.)

Primary Examiner—Roy King
Attorney, Agent, or Firm—V. D. Duraiswamy; W. K. Denson-Low

[57] ABSTRACT

An oxide superconductor having a high critical temperature is provided with a passivation coating comprising a first layer of a Group II oxide, such as magnesium oxide, and a second layer of a polymer, such as polyimide. The Group II oxide is formed under conditions to be substantially amorphous. After depositing the Group II, layer, the encapsulated superconductor is heated to an elevated temperature for a period of time in an oxidizing atmosphere. This restores the high critical temperature to its original value. The polymer is then coated on top of the Group II oxide and cured. The passivation coating is resistant to strong acids, strong bases, and water, is robust, hard, and resilient against scratching.

26 Claims, 2 Drawing Sheets

PASSIVATION OF THIN FILM OXIDE SUPERCONDUCTORS

This is a division of application Ser. No. 07/608,120 filed Nov. 1, 1990, now U.S. Pat. No. 5,114,910.

BACKGROUND OF THE INVENTION

Field of the Invention

The present invention relates to superconductor materials, and, more particularly, to the passivation of high critical transition temperature oxide superconductor materials, such as $Y_1Ba_2Cu_3C_{7-x}$.

Description of Related Art

Recent developments in high critical temperature ($T_c$) superconductivity research have led to microwave devices as the first practical application of this new technology. The world's first high performance 6-pole, X-band, bandpass filters, which have applications in low noise amplifiers, have been announced by researchers at Hughes Aircraft's Malibu Research Laboratories.

Such devices employ $Y_1Ba_2Cu_3O_{7-x}$ (YBCO) films. In order to use such devices in a practical system, the YBCO films must be protected from hostile environments, including air, heat, acids, bases, as well as mechanical abuse such as scrapes, etc. YBCO, whether as high quality thin films or in bulk form, is subject to deterioration when exposed to a large variety of conditions including:

1. Elevation to temperatures above 100° C., which causes loss of oxygen from the YBCO and consequently the degradation of superconductor performance, that is, lower critical transition temperature ($T_c$) and higher surface resistance ($R_S$).
2. Corrosion of the YBCO when exposed to acid solutions or vapors; the YBCO will suffer complete degradation.
3. Corrosion of the YBCO when exposed to basic solutions or vapors; the YBCO will suffer complete degradation.
4. Contact with materials which can either react with the YBCO or materials that getter oxygen out of the YBCO material.

Therefore, it is imperative to passivate the YBCO thin films in order to ensure that the device will have long term stable and reliable operation.

Passivation of YBCO superconductors has been reported. Y. Shiraku et al in Japanese Patent Application JP 87-151209 (Jun. 19, 1987) describe the preparation of a passivating layer. MgO powder is mixed with polyimide to form a paste or slurry. This mixture is then spread on YBCO bulk ceramic and fired at between 1,000° and 1,100° C. to form the passivation layer. This kind of heating procedure, however, would completely destroy a thin YBCO film. It is also doubtful that the process described in this reference actually forms a good passivation material, since the polyimide binder is burned off during firing at high temperature and the burn-off of binders usually leads to porosity in the sintered ceramic. Porosity in a passivating film would, of course, be undesirable in a layer designed to encapsulate and passivate the YBCO surface.

Other passivation materials mentioned in this reference and in the scientific literature include $SiO_2$, $Al_2O_2$, AlN, SiN, TiN, Ag, Au, and Bi deposited in an activated oxygen atmosphere. One important deficiency in the literature relating to such materials is the absence of measurements showing the effect of the passivation material on the RF electrical properties of the high $T_c$ superconductor. Measurements of the d.c. electrical resistivity or the low frequency a.c. susceptibility do not necessarily provide a critical way of determining the degradation of the superconductor. Indeed, the present inventors have found that some passivation layers which appear to have good behavior measured by a.c. susceptibility or resistivity, have poor $R_S$ performance.

A need remains for a good passivation coating for YBCO and other oxide superconductors, such as Bi-Sr-Ca-Cu-O and Tl-Ca-Ba-Cu-O.

SUMMARY OF THE INVENTION

In accordance with the invention, a passivation coating and process for applying the coating are provided for oxide superconductor materials. The passivation layer comprises a thin film of a Group II oxide formed on the surface of the oxide superconductor and a coating of a polymer thereover having polyimide-like properties.

In the process of the invention, the Group II oxide film is deposited at ambient temperature in an inert atmosphere, with the substrate less than about 50° C. to ensure that the oxide film is substantially amorphous, rather than crystalline or polycrystalline. The coated superconductor is then heated in the presence of oxygen to restore the high $T_c$ that is reduced during the oxide deposition. The polymer layer is next spun-on and then cured.

The composite passivation layer provides a protective coating for the YBCO. The quality of the coating is superior to prior art passivation coatings and to crystalline MgO, crystalline $BaF_2$, $Y_2O_3$, $BaTiO_3$, and polyimide alone.

DESCRIPTION OF THE PREFERRED EMBODIMENTS

Figure 1:
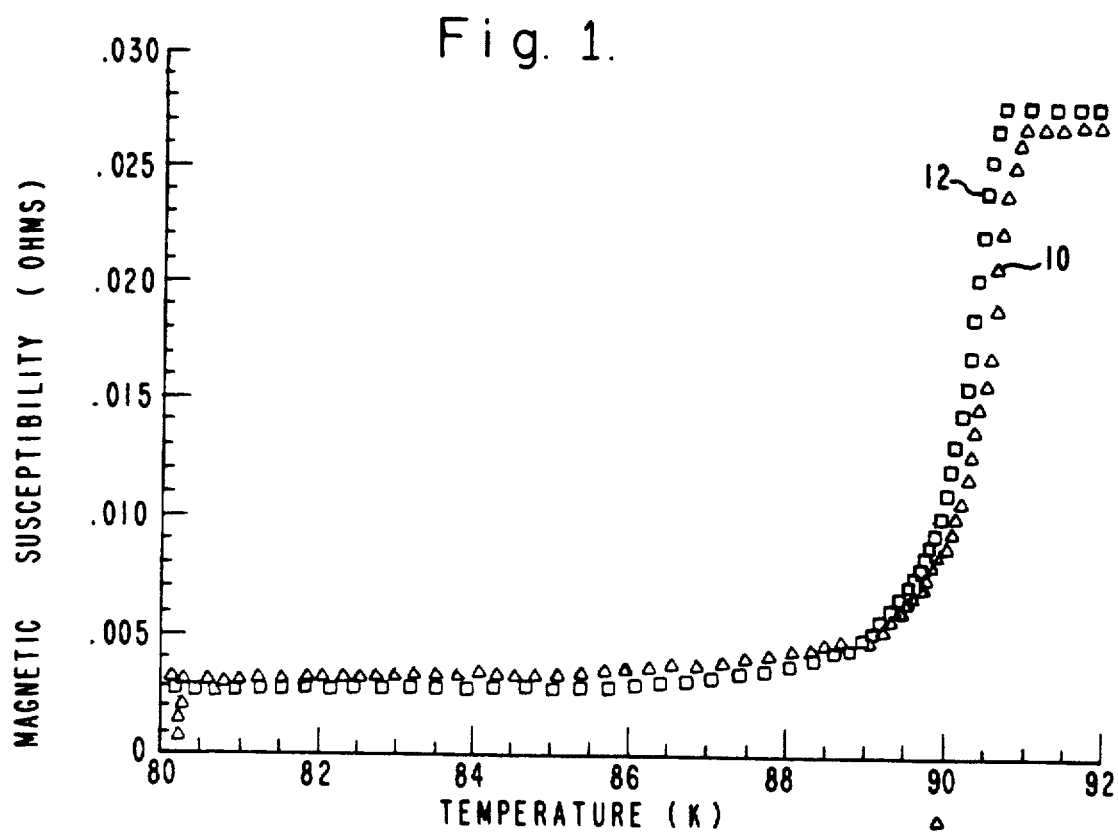
FIG. 1 on coordinates of magnetic susceptibility (ohms) and temperature (K), are plots of the magnetic a.c. susceptibility for a $Y_1Ba_2Cu_2O_{7-x}$ film as grown and with an amorphous MgO film deposited thereon.

The passivation layer of the invention comprises a thin film of a Group II oxide and a layer of a polymer having polyimide-like properties. The passivation layer is applied to an oxide superconductor, such as $Y_1Ba_2Cu_3O_{7-x}$.

$Y_1Ba_2Cu_3O_{7-x}$ has a transition temperature ($T_c$) of about 90K. Other oxide superconductors beneficially treated by the process of the invention also have a high $T_c$ (that is, greater than about 77K). Examples of such other oxide superconductors include Bi-Sr-Ca-Cu-O and Tl-Ca-Ba-Cu-O, specifically, $Bi_2Sr_2Ca_2Cu_3O_{10}$ ($T_c \approx 110K$) and $Tl_2Ca_2B_2Cu_2O_{10}$ ($T_c \approx 125K$).

The Group II oxide may be any of magnesium oxide, calcium oxide, barium oxide, and strontium oxide. Magnesium oxide is preferred, due to its known compatibility with oxide superconductors. The description which follows is in terms of magnesium oxide films, although it will be understood that the same considerations apply to other Group II oxides.

The thickness of the oxide film cannot be too thin; otherwise, pinholes will develop, which will render its passivation property useless. Further, the thickness of the oxide film cannot be too thick, since otherwise the build-up of stresses will cause cracking. Consistent with these considerations, the thickness of the oxide film may range from about 500 Å to 2 μm, and is preferably about 1,000 Å.

The oxide film may be deposited by any of the well-known vacuum deposition procedures for depositing thin films, such as sputtering, electron-beam evaporation, molecular beam evaporation, metal-organic chemical vapor deposition, and the like. Sputtering is preferred, since it is important to keep the temperature of the substrate (the superconductor film) at a comparatively low temperature, as described in further detail below.

When sputtering of MgO is employed, the purity of the target need only be 99.95%. During sputtering, an inert gas, which is readily ionizable, is utilized. Argon is preferred, simply because it is well characterized and widely used in micro-electronic circuit processing. However, nitrogen may also be used under certain conditions.

The pressure of the inert gas during sputtering ranges from about 1 to 25 mTorr.

The substrate temperature is maintained at a temperature below about 50° C., and preferably near ambient. Maintaining the substrate in this temperature range in conjunction with the use of argon gas during sputtering ensures production of an amorphous film of MgO, which is essential to the operability of the passivation layer of the invention. Heating the substrate to over 100° C. during sputter deposition in the presence of a small amount of nitrogen gas is sufficient to produce a polycrystalline film, which is unsuitable in the practice of the invention.

Due to the presence of grain boundaries, polycrystalline films are believed to provide a means of oxygen transport out of the oxide superconductor film, resulting in irreversible reduction of the critical temperature. Amorphous films, on the other hand, have been found by the inventors to provide an impervious barrier to oxygen, $CO_2$, water vapor, and hydrocarbon contaminants.

The MgO film must be amorphous to at least the extent of providing a continuous amorphous film across the entire superconductor film. Thus, this definition permits the inclusion of small MgO crystallites embedded in the amorphous film. However, the MgO film is preferably at least about 99% amorphous, to ensure adequate passivation of the superconductor film.

The MgO-coated superconductor film is next exposed to an oxidizing atmosphere at an elevated temperature. The purpose of this treatment is to recover the critical temperature, which tends to drop several degrees during MgO deposition.

Air or pure oxygen may be used. The temperature ranges from about 400° to 600° C., preferably about 500° C. The MgO-coated superconductor film is exposed to the elevated temperature for a period of time ranging from about 1 sec to 2 hrs, with very short times achieved by the well-known process of rapid thermal annealing (RTA). More critical is the cooling rate from the elevated temperature to room temperature; if the rate is too fast, then there will not be sufficient time for the oxygen to stabilize the YBCO superconducting phase. A cooling rate that is too slow is simply too time consuming. Consistent with these considerations, a cooling rate of about 1° C./hr to 10° C./min is advantageously employed. Simply shutting off the furnace provides a cooling rate within the desired range.

The ramp-up to the desired temperature is dependent on the mismatch between the thermal coefficients of expansion of the Group II oxide and the superconducting oxide. The MgO-coated superconducting oxide can be placed in the furnace and brought up to the desired temperature. Alternatively, the furnace can be pre-heated, and the superconducting oxide introduced thereinto, over a span of time of about 1 min.

Following healing of the $T_c$ of the superconducting film, the MgO is next coated with a polymer which is resistant to strong acids, strong bases, and water and is robust, hard, and resilient to scratching. There are examples of several polymers that possess the requisite properties; these include polyimide, polybenzyl methacrylate, polybutyl methacrylate, polybutyl styrene, polybutadiene, styrenes, polyamide resins, polyacrylics, polyacrylamides, polystyrenes, polyethylene, polyisoprene, polymethyl pentenes, polymethyl methacrylates, and polyvinyls. However, since polyimide is widely used in passivating high speed semiconductor devices and is well-accepted in that industry, it is preferably employed in the practice of the invention.

The polymer is advantageously deposited by spinning on prepolymer dissolved in a solvent. The polymer is formed by curing the coating at an elevated temperature. For example, polyimide is cured at about 150° to 200° C. for about ½ to 1 hour, the shorter times associated with the higher temperatures. The manufacturer recommends a cure of about 200° C.

The polymer coating is formed to a thickness of about 1 to 10 μm, and preferably about 1 to 3 μm.

It should be noted that use of polyimide alone, without the underlayer of MgO, would result in a lowering of the $T_c$ of the underlying superconductor by about 10K. The $T_c$ could be recovered by heating the superconductor to about 500° C., as described above, but the polymer would be burned off. Thus, polyimide alone is unsatisfactory.

In this connection, other thin film layers were investigated for their passivation properties, in addition to polyimide alone. The materials investigated included crystalline MgO, crystalline $BaF_2$, $Y_2O_3$, and $BaTiO_3$. None of these materials provided the requisite protection from all items and criteria described above.

Without subscribing to any particular theory, it appears that the amorphous MgO film either traps oxygen coming out of the superconducting film or could itself be supplying oxygen to the superconducting film. In either event, the net result is that the amorphous MgO film appears to be impervious to oxygen.

Having devices that are passivated makes testing and packaging significantly easier and adds to the reliability and long term stability of the devices. The passivation coating disclosed herein offers protection from all the items and criteria described above. Once MgO has been deposited and heated, it acts as a protective buffer layer for polyimide, which provides an inert protective coating.

EXAMPLES

Example 1

A YBCO film (3,500 Å) was coated with MgO (1,000 Å) by RF magnetron sputtering MgO using an Ar plasma gas at a pressure of 10 mTorr with the substrate at ambient temperature. The deposition rate was 10 Å/min. This deposition resulted in an amorphous MgO film, as determined using X-ray diffraction analysis, which encapsulated the YBCO film. After the sputter deposition of MgO, there was a reduction in the $T_c$ of the YBCO by approximately 7K to $\approx$83K. The $T_c$ of the YBCO film covered by the MgO film was restored to 90K by heating in a pure oxygen environment for several minutes at 500° C. and then using a cool down rate of 1.5° C./-min. This was accomplished by placing the MgO-coated YBCO film in a furnace, bringing the furnace up to 500° C., and then shutting the furnace off when it achieved that temperature. After cooling, a 1 μm thick layer of polyimide was spun on and cured at 200° C.

FIG. 1 depicts the magnetic a.c. susceptibility as a function of temperature of a passivated $Y_1Ba_2Cu_3O_{7-x}$ (3,500 Å) thin film prior to passivation (Curve 10; Δ) and subsequent to passivation, employing a film of MgO (1,000 Å) after heating to 500° C. (Curve 12; □). It can be seen that the $T_c$ is substantially unchanged, and that the properties of the superconductor are nearly recovered as a result of the processing of the invention. The addition of a polyimide film (1 μm) and subsequent curing at 200° C. had no effect on Curve 12.

Figure 2:
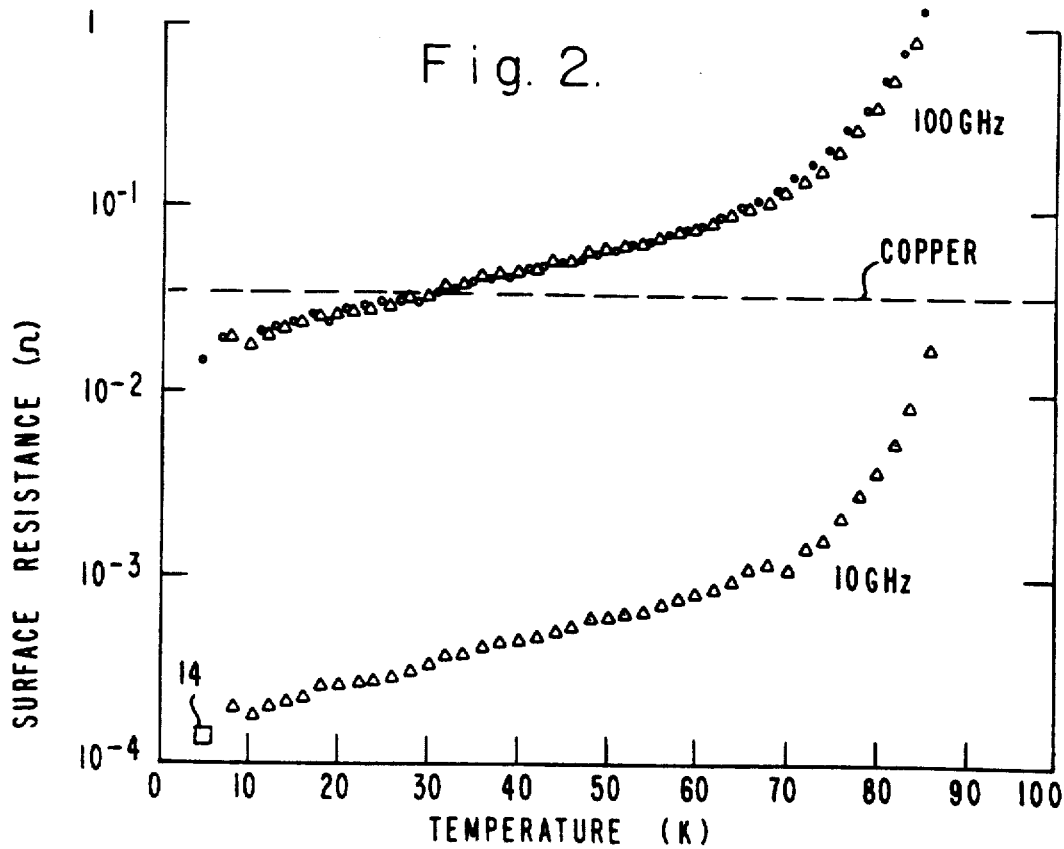
FIG. 2 on coordinates of surface resistance (ohms) and temperature (K), are plots of the microwave cavity surface resistance measurements at 100 GHz for a $Y_1Ba_2Cu_3O_{7-x}$ film as grown and with an amorphous MgO film deposited thereon, together with a single data point at 10 GHz and extrapolation of the 100 GHz data to 10 GHz.

FIG. 2 depicts the microwave 100 GHz cavity surface resistance ($R_s$) measurements as a function of temperature on a film such as described in connection with FIG. 1, pri- or to passivation (Δ) and subsequent to passivation (o), employing the MgO film of FIG. 1. The $R_s$ performance of the YBCO film before and after passivation was the same.

FIG. 2 also depicts the calculated curve at 10 GHz, which is based on $f^2$ projection. Although this is a calculated result, it is to be compared with the single data point at 14, which is a stripline measurement at 4.2K and 10 GHz. The extrapolation of data is seen to be consistent with the measurement.

FIG. 2 shows that the YBCO films are deposited reproducibly and that the results obtained for $R_s$ using different techniques are in agreement; and that the sputtered amorphous MgO film does not degrade the superconducting performance of a YBCO thin film.

Figure 3:
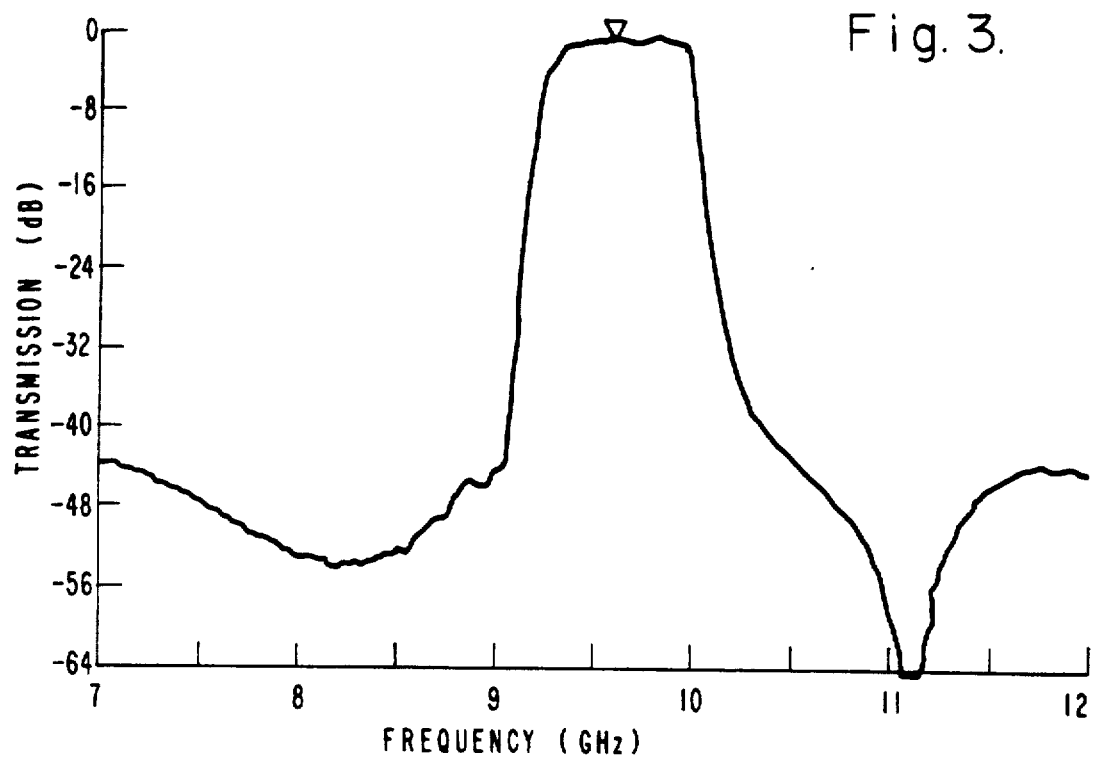
FIGS. 3 and 4 on coordinates of transmission (dB) and frequency (GHz), are plots showing the performance of a microwave filter with (FIG. 3) and without (FIG. 4) the composite passivation layer of the invention.
Figure 4:
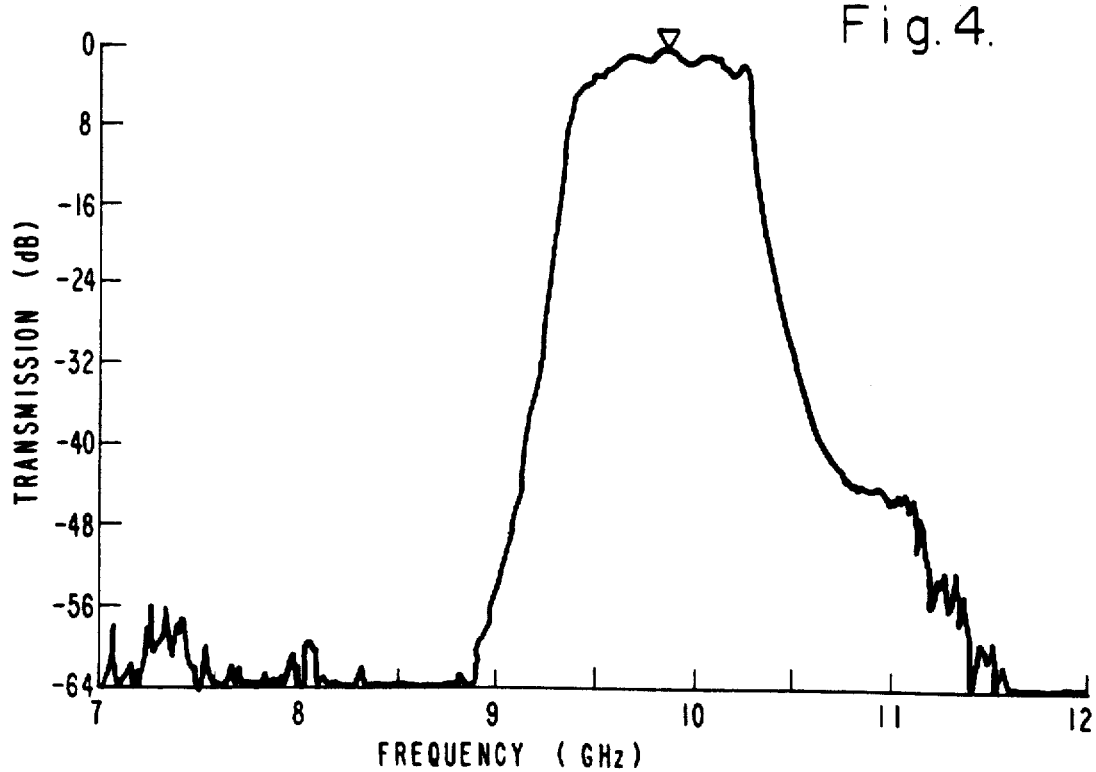

YBCO microstrip X-band bandpass filters were constructed, with and without MgO passivation. The results are depicted in FIGS. 3 and 4, respectively. The passivated device also had a film of polyimide deposited over the top of the MgO thin film after the heating cycle. Both 6-pole filters were fabricated using YBCO films originating from the same 2 inch coated $LaAlO_3$ substrate, so that the film composition and other parameters were similar. As can be seen from the insertion loss for devices with and without MgO, there is essentially no measurable difference between them; the uncertainty in the measured insertion loss is $\approx$0.15 dB.

EXAMPLE 2

For comparison with other materials, the Table below lists the onset of superconductivity and the breadth of the transition temperature resulting from depositing on the superconductor (a) an amorphous MgO layer, (b) an amorphous MgO layer plus polyimide (the passivating layer of the invention), (c) a crystalline MgO layer, (d) a $BF_2$ layer, (e) a $BF_2$ layer plus polyimide, (f) a $BaTiO_3$ layer, (g) a $BaTiO_3$ layer plus polyimide, and (h) a polyimide layer.

TABLE

Comparison of Various Overlayers.

| Overlayer Material | Transition Temperature (K) | | | |
|---|---|---|---|---|
| | Before Overlayer | As-deposited Overlayer | +500° C. Sinter | 500° C. Sinter + Polyimide |
| MgO[a] | | | | |
| (1) | 87K | 87K br | 86K nar | 86K nar |
| (2) | 91K | 84.5K br | 89.7K nar | 89.5K |
| (3) | 91K | — | 90.8K nar | — |
| MgO[b] | 89K | 65K | 87K br | |
| $BF_2$ | 88K | 82.5K v br | 82.5K[c] nar 85K[d] | — br tr |
| $BaTiO_3$ | 90.5K | 88K br | 89K br | br tr |
| Polyimide | 87K | 64K br | — | — |

Notes:
[a]amorphous MgO, room temperature deposition (three separate runs).
[b]polycrystalline MgO, 100° C. deposition.
[c]after first sinter.
[d]after second sinter.
br = broad transition, about 2 to 10K range.
nar = narrow transition, about 1K range.
br tr = broad transition, $T_c$ does not return.

As can be seen from the foregoing Table, the process of the invention, employing amorphous MgO, sintering, and polyimide overlayer, provides a coated superconductor that has substantially the same $T_c$ after processing as before. With other coatings, the $T_c$ is either lost or so broadened as to be useless as a superconductor.

What is claimed is:

1. A process for forming a passivating coating on an oxide superconductor comprising:
   (a) depositing a first layer of a Group IIA oxide selected from the group consisting of MgO, CaO, SrO, and BaO so as to encapsulate said oxide superconductor, said Group IIA oxide being deposited so as to form a substantially amorphous structure;
   (b) heating said encapsulated superconductor to an elevated temperature above 50° C. in an oxidizing atmosphere; and
   (c) applying a second layer of a polymer covering said Group IIA oxide layer, said polymer comprising a composition resistant to strong acids, strong bases, and water.

2. The process of claim 1 wherein said oxide superconductor is selected from the group consisting of Y-Ba-Cu-O, Bi-Sr-Ca-Cu-O, and Tl-Ca-Ba-Cu-O.

3. The process of claim 2 wherein said oxide superconductor is selected from the group consisting of $Y_1Ba_2Cu_3O_{7-x}$, where x ranges from 0 to 1, $Bi_2Sr_2Ca_2Cu_3O_{10}$, and $Tl_2C_2Ba_2Cu_3O_{10}$.

4. The process of claim 1 wherein said Group IIA oxide layer is deposited to a thickness ranging from about 500 Å to 2 μm in thickness.

5. The process of claim 4 wherein said Group IIA oxide layer is deposited to a thickness of about 1,000 Å.

6. The process of claim 1 wherein said Group IIA oxide layer is sputtered in the presence of an inert, ionizable gas onto said oxide superconductor.

7. The process of claim 6 wherein said Group IIA oxide layer is sputtered in the presence of argon.

8. The process of claim 6 wherein the pressure of said inert gas ranges from about 1 to 25 mTorr.

9. The process of claim 1 wherein said superconductor is maintained at a temperature of less than about 50° C. during the deposition of said Group IIA oxide.

10. The process of claim 1 wherein said encapsulated superconductor is heated in an oxygen-containing environment to an elevated temperature ranging from about 400° to 600° C. and then cooled to ambient temperature.

11. The process of claim 10 wherein said encapsulated superconductor is maintained at said elevated temperature for about 1 sec to 2 hrs.

12. The process of claim 10 wherein said encapsulated superconductor is cooled to ambient temperature at a cooling rate ranging from about 1° C./hr to 10° C./min.

13. The process of claim 1 wherein said polymer is selected from the group consisting of polyimide, polybenzyl methacrylate, polybutyl methacrylate, polybutyl styrene, polybutadiene, styrenes, polyamide resins, polyacrylics, polyacrylamides, polystyrenes, polyethylene, polyisoprene, polymethyl pentenes, polymethyl methacrylates, and polyvinyls.

14. The process of claim 1 wherein said polymer layer is applied to a thickness ranging from about 1 to 10 μm.

15. The process of claim 14 wherein said polymer layer is applied to a thickness ranging from about 1 to 3 μm.

16. The process of claim 1 wherein said polymer is spun-on said Group IIA oxide and cured.

17. A process for forming a passivating coating on an oxide superconductor consisting essentially of $Y_1Ba_2Cu_3O_{7-x}$, where x ranges from 0 to 1, comprising:

(a) depositing a first layer of substantially amorphous magnesium oxide encapsulating said oxide superconductor;

(b) heating said encapsulated superconductor to an elevated temperatures above 50° C. in the presence of an oxidizing atmosphere; and (c) applying a second layer of polyimide covering said magnesium oxide layer.

18. The process of claim 17 wherein said magnesium oxide layer is deposited to a thickness ranging from about 500 Å to 2 μm.

19. The process of claim 18 wherein said magnesium oxide layer is deposited to a thickness of about 1,000 Å.

20. The process of claim 17 wherein said magnesium oxide layer is sputtered onto said oxide superconductor in the presence of argon, said oxide superconductor being maintained at a temperature of less than about 50° C.

21. The process of claim 17 wherein said encapsulated superconductor is heated in an oxygen-containing environment to said elevated temperature, said elevated temperature being about 500° C., and then cooled to ambient temperature.

22. The process of claim 21 wherein said encapsulated superconductor is exposed to said elevated temperature by heating said encapsulated superconductor in a furnace that is brought to said elevated temperature and then shut off.

23. The process of claim 21 wherein said encapsulated superconductor is cooled to ambient temperature at a cooling rate ranging from about 1° C./hr to 10° C./min.

24. The process of claim 3 wherein said polyimide is applied to a thickness ranging from about 1 to 10 μm.

25. The process of claim 24 wherein said polyimide is applied to a thickness ranging from about 1 to 3 μm.

26. The process of claim 17 wherein said polyimide layer is spun-on said magnesium oxide and cured.

* * * * *

UNITED STATES PATENT AND TRADEMARK OFFICE
CERTIFICATE OF CORRECTION

PATENT NO. : 5,272,133
DATED : December 21, 1993
INVENTOR(S) : J. Josefowicz et al It is certified that error appears in the above-indentified patent and that said Letters Patent is hereby corrected as shown below:

Title page, item [57] in the Abstract, line 7, between "II" and "layer" delete", (a comma)".

Column 7, Claim 16, line 1, after "polymer" insert --layer--.

Column 8, Claim 17, line 8, delete "temperatures" and insert instead --temperature--.

Column 8, Claim 24, line 1, after "polyimide" insert --layer--.

Column 8, Claim 25, line 1, after "polyimide" insert --layer--.

Signed and Sealed this

Twelfth Day of September, 1995

Attest:

BRUCE LEHMAN

Attesting Officer     Commissioner of Patents and Trademarks